(12) United States Patent
Crane, Jr. et al.

(10) Patent No.: US 7,135,768 B2
(45) Date of Patent: Nov. 14, 2006

(54) HERMETIC SEAL

(75) Inventors: Stanford W. Crane, Jr., Santa Clara, CA (US); Myoung-Soo Jeon, Fremont, CA (US); Matthew E. Doty, Phoenix, AZ (US)

(73) Assignee: Silicon Bandwidth Inc., Fremont, CA (US)

( * ) Notice: Subject to any disclaimer, the term of this patent is extended or adjusted under 35 U.S.C. 154(b) by 0 days.

(21) Appl. No.: 09/946,554

(22) Filed: Sep. 6, 2001

(65) Prior Publication Data

US 2003/0042598 A1 Mar. 6, 2003

(51) Int. Cl.
 *H01L 23/12* (2006.01)
 *H01L 23/10* (2006.01)
(52) U.S. Cl. ............... 257/710; 257/704; 257/705; 257/707; 257/709
(58) Field of Classification Search ......... 257/680, 257/682, 693, 698, 704, 757, 738, 778, 779, 257/780, 710, 711, 712, 717, 729, 730
See application file for complete search history.

(56) References Cited

U.S. PATENT DOCUMENTS

| | | | | | |
|---|---|---|---|---|---|
| 4,750,031 | A | * | 6/1988 | Miller et al. | 257/702 |
| 5,185,653 | A | * | 2/1993 | Switky et al. | 257/729 |
| 5,194,695 | A | * | 3/1993 | Maslakow | 174/52.4 |
| 5,239,806 | A | * | 8/1993 | Maslakow | 53/432 |
| 5,248,901 | A | | 9/1993 | Temple | |
| 5,270,262 | A | * | 12/1993 | Switky et al. | 437/217 |
| 5,350,713 | A | * | 9/1994 | Liang | 438/106 |
| 5,572,065 | A | | 11/1996 | Burns | |
| 6,303,986 | B1 | * | 10/2001 | Shook | 257/680 |
| 6,320,257 | B1 | * | 11/2001 | Jayaraj et al. | 257/723 |
| 6,384,473 | B1 | * | 5/2002 | Peterson et al. | 257/680 |
| 6,392,308 | B1 | * | 5/2002 | Muto et al. | 257/787 |
| 6,489,178 | B1 | * | 12/2002 | Coyle et al. | 438/51 |
| 6,674,159 | B1 | * | 1/2004 | Peterson et al. | 257/680 |

* cited by examiner

*Primary Examiner*—Nathan J. Flynn
*Assistant Examiner*—Fazli Erdem
(74) *Attorney, Agent, or Firm*—McKenna Long & Aldridge LLP

(57) ABSTRACT

Ultrasonically formed seals, their use in semiconductor packages, and methods of fabricating semiconductor packages. A brittle center member (such as glass) has a molded edge member. That edge member is ultrasonically welded to a body. The molded edge member and body are comprised of ultrasonically weldable materials. A hermetically sealed semiconductor package includes a lid with a brittle center plate and a molded edge. The molded edge is ultrasonically welded to a body. Locating features that enable accurate positioning of the lid relative to the body, and energy directors can be included. Pins having a relieved portion and a protruding portion can also be hermetically sealed to the body. Such pins can have various lengths that enable stadium-type pin rows. The pins can be within channels, which can hold a sealant. The body can include a device that is electrically connected to the pins.

32 Claims, 15 Drawing Sheets

HERMETIC SEAL

BACKGROUND OF THE INVENTION

1. Field of the Invention

The present invention relates to packages and sealing techniques, and more particularly, to hermetic seals, hermetically sealed semiconductor packages, and hermetic sealing techniques.

2. Discussion of the Related Art

Semiconductor packages have proven useful in protecting integrated circuits and in attaching those circuits to electrical boards. More recently, such semiconductor packages have proven useful in protecting and mounting devices such as Micro-Electro Mechanical Systems (MEMS) assemblies and other imaging devices.

Semiconductor packages protect integrated circuits from harm caused by humidity, harmful gases, and various materials used in electronic assembly. Such protection usually takes the form of an airtight environmental seal, referred to herein as a hermetic seal. However, hermetic seals are used in many more applications than environmentally sealing semiconductor packages. Therefore, a hermetic seal as used herein refers to any environmental seal of any enclosed space.

Hermetically sealing semiconductor packages presents various challenges. For example, a semiconductor package might be subjected to a wide range of temperatures and thermal differentials, vibrations, accelerations, impacts, loads, and radiations. Compounding the sealing challenge is the relatively large number of individual hermetic seals that can be required. To understand this, consider that an integrated circuit (or another device) must be mounted in the package. Thus, a seal for an access port (usually a lid) is required. Further consider that an integrated circuit must electrically connect to an external circuitry, and that electrically conductive leads or pads, possibly a very large number of such leads or pads, must pass through the semiconductor package. Each of those leads or pads requires a hermetic seal. Another challenge is that in some applications, such as micro-mirror assemblies and UV erasable memories, light must pass through the semiconductor package. Still another challenge is hermetically sealing at high speed and at low cost.

Prior art semiconductor packages are generally comprised of a body having an embedded set of conductive leads and a cavity for holding a protected device. Electrical bonding wires electrically interconnect the conductive leads and the protected device. A lid is then placed over the cavity's access port. That lid is usually attached to the body using an adhesive such as an epoxy. Additionally, the locations where the conductive leads enter the body are usually sealed with a sealing compound, often an epoxy. The lid adhesive and sealing compound are typically applied using a liquid dispenser. Time, heat, and/or UV light is used to cure the dispensed liquid.

Examples of prior art semiconductor packages include Dual In-Line Packages (DIP), Plastic Pin Grid Array packages (PPGA), and Small Outline Integrated Circuit (SOIC) packages. For cost considerations, the body and lid are usually thermoplastic. However, ceramic semiconductor packages are sometimes used, particularly when light must pass through the semiconductor package. Then, a ceramic body and a ceramic lid having a transparent glass window are beneficial.

While generally successful, prior art semiconductor packages have certain problems. For example, bonding the lid to the body and sealing the conductive leads using a dispensed liquid are time consuming and can lead to contamination. Also, the required handling steps when applying the adhesive and/or sealing compound can lead to physical damage to the package or to the packaged device. Furthermore, many adhesives and sealants introduce moisture into the cavity, possibly leading to device corrosion and failure, or to hermetic seal cracks caused by thermally induced pressure during soldering or operation of the protected device. Indeed, any difference in the coefficients of thermal expansion of any of the parts can induce stresses and/or strains that can lead to hermetic seal failure.

Modern high-density integrated circuits (ICs) having a large number of connections place additional stresses on prior art hermetic seal techniques. For example, some integrated circuits require well over one hundred pins. Hermetically sealing such a large number of pins is difficult and time consuming as careful pin placement and alignment becomes increasingly critical and difficult, as does ensuring a reliable hermetic seal.

One prior art approach to hermetic sealing uses ultrasonic welding. Ultrasonic welding refers to welding using an intense, controlled vibration that develops friction-induced heating between elements. This heating, combined with pressure, causes melting of one or both of the welded elements at the interface between those elements. Upon solidification, a mechanical bond is created between the elements. According to the prior art, when ultrasonic welding is used with semiconductor packages, frictional heat is developed by placing a lid on a body, applying a predetermined pressure between the lid and the body, and then applying an intense ultrasonic vibration to the lid. The intense vibration is transmitted through the lid to induce a welding temperature. The induced temperature causes a flow of melted material that produces a semi-hermetic or hermetic seal between the lid and the body.

With prior art ultrasonic welding of semiconductor packages, a thermoplastic body and lid are preferred. Thermoplastic materials are common, inexpensive, and ultrasonically weld readily. Furthermore, thermoplastics are typically resilient, have only a relatively small amount of outgassing, and can have matching thermal coefficients of expansion.

While ultrasonic welding of semiconductor packages is useful, prior art ultrasonic welding techniques do not work well when attempting to hermetically seal brittle materials, such as ceramics and glass. Direct ultrasonic welding of those materials, even to a thermoplastic body, tends to induce cracks, breaks, and other damage to the brittle material.

Therefore, a new type of hermetic seal would be beneficial. Even more beneficial would be a new type of hermetic seal that is useful for hermetically sealing semiconductor packages. In particular, a new type of hermetic seal capable of sealing conductive pins to a body, and/or a lid to a body would be useful. Furthermore, a new hermetically sealed semiconductor package would also be beneficial. Also beneficial would be a new method of producing hermetic seals and a new way of assembling semiconductor packages.

SUMMARY OF THE INVENTION

Accordingly, the principles of the present invention enable a hermetic seal that is useful for hermetically sealing semiconductor packages. Furthermore, those principles enable hermetic sealing of conductive pins to a body and/or of a lid, including a glass lid, to a body. Those principles also enable high speed, low cost packaging of devices having a large number of electrical connections. Thus, the principles of the present invention enable a new hermetically sealed semiconductor package, as well as a new method of producing such a hermetically sealed semiconductor package.

A hermetically sealable structure according to the principles of the present invention includes a center member and a molded edge member around the perimeter of the center member. Beneficially, the molded edge member and the center member are insert molded together to form an integral unit. The molded edge member preferably includes an ultrasonically weldable material, such as a thermoplastic, while the center member includes a brittle material, such as glass.

A hermetically sealable lid according to the principles of the present invention includes a center plate and a molded edge around the perimeter of that center plate. Beneficially, the molded edge and the center plate are insert molded together to form an integral unit. Furthermore, the center plate is beneficially comprised of a brittle material, such as a ceramic or a glass. The molded edge can be as thick as the center plate, thinner, or thicker. To aid assembly, the lid can include locating features that enable accurate positioning of the lid relative to another structure. Furthermore, the lid can include an energy director such as a protrusion. Thermoplastics are useful in forming the molded edge, energy director and locating feature.

A semiconductor package according to the principles of the present invention includes a body and a lid that are hermetically sealed together, wherein the lid includes a center plate and a molded edge. Beneficially, the molded edge and the center plate are insert molded as an integral unit. Furthermore, the center plate is beneficially comprised of a brittle material, such as a ceramic or a glass. The molded edge can be as thick as the center plate, thinner, or thicker. Even more beneficially, the molded edge and the body are comprised of a similar or identical material. To aid assembly, the body and the lid can include locating features that enable accurate positioning of the lid relative to the body. Furthermore, either the body or the lid can include an energy director such as a protrusion, and/or a locating feature such as an opening or a protruding member. Thermoplastics are useful in forming the molded edge, energy director and protruding member.

Another semiconductor package according to the principles of the present invention includes a body and a lid that are hermetically sealed together by ultrasonic welding. That lid beneficially includes a center plate and a molded edge around the perimeter of the center plate. The molded edge is preferably insert molded with the center plate so as to form an integral unit. Even more beneficially, the center plate is a brittle material, such as glass. Either the body or the lid can include an energy director. Beneficially, the body and lid include locating features that enable the body and the lid to be accurately positioned relative to each other. Thermoplastics are useful in forming the molded edge, energy director, and locating features. The body and the lid are positioned together, pressure is applied, and ultrasonic energy is directed through the molded edge into the body such that the resulting heat and pressure form an ultrasonic weld.

Another semiconductor package according to the principles of the present invention includes a body having a plurality of openings. That package further includes a plurality of pins, each inserted into an associated one of the plurality of openings. Each pin is comprised of an elongated member having a relieved portion and a protruding portion. Those pins are hermetically sealed to the body by ultrasonic welding. Beneficially, the body includes internal walls adjacent the openings. Those walls define a channel container for a sealing material over the locations wherein the pins extend into the body. A sealant can be located in the channel container. Beneficially, the interior of the body is shaped as a stadium, with rows of pins at different levels such as in stadium seating. The body is beneficially comprised of a thermoplastic.

Still another semiconductor package according to the principles of the present invention includes a body, a lid, and plurality of elongated pins. The lid beneficially includes a center plate and a molded edge around the center plate. The molded edge is preferably insert molded with the center plate to form an integral unit. Even more beneficially, the center plate is a brittle material, such as glass. Either the body or the lid can include an energy director. Beneficially, the body and lid include locating features that enable the body and the lid to be accurately positioned relative to each other. The elongated pins are inserted into openings in the body. Each pin is comprised of an elongated member having a relieved portion. Those pins are hermetically sealed to the body by ultrasonic welding. Beneficially, the body includes internal walls adjacent the openings. Those walls define a container for a sealing material over the locations wherein the pins extend into the body. A sealant can be located in the container. Beneficially, the interior of the body is shaped as a stadium with rows of pins at different levels, such as in stadium seating. The body, molded edge, locating features, and energy director are beneficially comprised of a thermoplastic.

A sealing method according to the principles of the present invention includes insert molding an edge material onto a brittle material to form a composite assembly. Then, ultrasonically welding that composite assembly to a body via the edge material. Beneficially, insert molding produces an energy director on the edge material. In that case, ultrasonic welding is then performed using the energy director. The sealing method is capable of a hermetic seal.

A method of sealing a lid to a semiconductor package according to the principles of the present invention includes insert molding an edge around a center plate to form a lid. Then, ultrasonically welding that lid to a body via the edge. Beneficially, insert molding produces an energy director on the edge, or the body includes an energy director. In either case, ultrasonic welding is beneficially performed using the energy director. The sealing method is capable of a hermetic seal.

A method of sealing a plurality of pins onto the body of a semiconductor package, according to the principles of the present invention, includes forming the body with a plurality of pin openings, and forming the pins with a relieved portion. Then, inserting the pins into the pin openings, and ultrasonically welding each pin to the body such that the body material flows into the relived portion and such that a seal, preferably hermetic, is formed at each pin. Beneficially, the body, is comprised of a thermoplastic.

A method of manufacturing a device according to the principles of the present invention includes procuring a lid; a body having a cavity, a receiving portion for the lid, and a plurality of pin openings; and a plurality of pins. Beneficially, the lid includes an insert molded edge around a center plate, and an energy director on the molded edge. Alternatively, the body beneficially includes an energy director on its receiving portion. Beneficially, the pins each include a relieved portion. The pins are inserted into the body and hermetically sealed to the body using ultrasonic welding. A device is then inserted into the cavity. The lid is then ultrasonically welded to the body. Beneficially, ultrasonic welding is performed using the energy director. A thermoplastic edge and body are preferred. Additionally, it is beneficial if the lid and body include locating features that enable alignment of the lid to the body.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention, and together with the description serve to explain the principles of the invention.

In the drawings.

DETAILED DESCRIPTION OF THE ILLUSTRATED EMBODIMENTS

Figure 1:
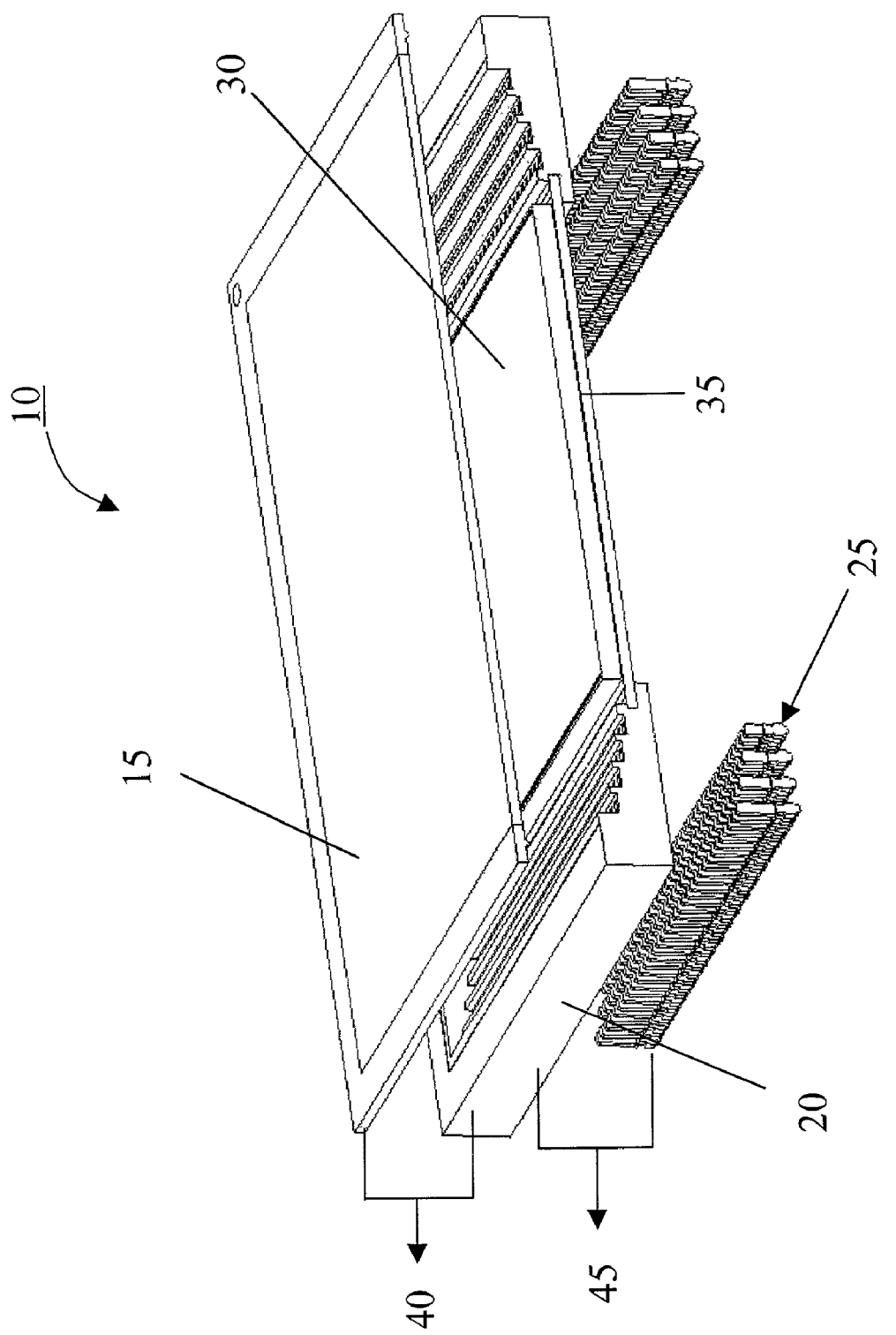
FIG. 1 is an exploded isometric view of a semiconductor package according to the principles of the present invention.

FIG. 1 illustrates an exploded view of a semiconductor package 10 that incorporates the principles of the present invention. That semiconductor package includes a lid 15, a body 20, a plurality of elongated pins 25, and a protected device 30. The protected device 30 can be an integrated circuit (or circuits) or a device such as a MEMS assembly. The protected device is attached to a mounting pad 35 of the body 20.

The semiconductor package 10 protects the device 30 and assists interconnecting that device to other circuitry. To that end, the semiconductor package 10 is capable of being hermetically sealed using ultrasonic welding techniques. If a hermetic seal is desired, the lid 15 and the body 20 are ultrasonically welded at a seal 40, while the body and the pins 25 are ultrasonically welded at seals 45.

Figure 2:
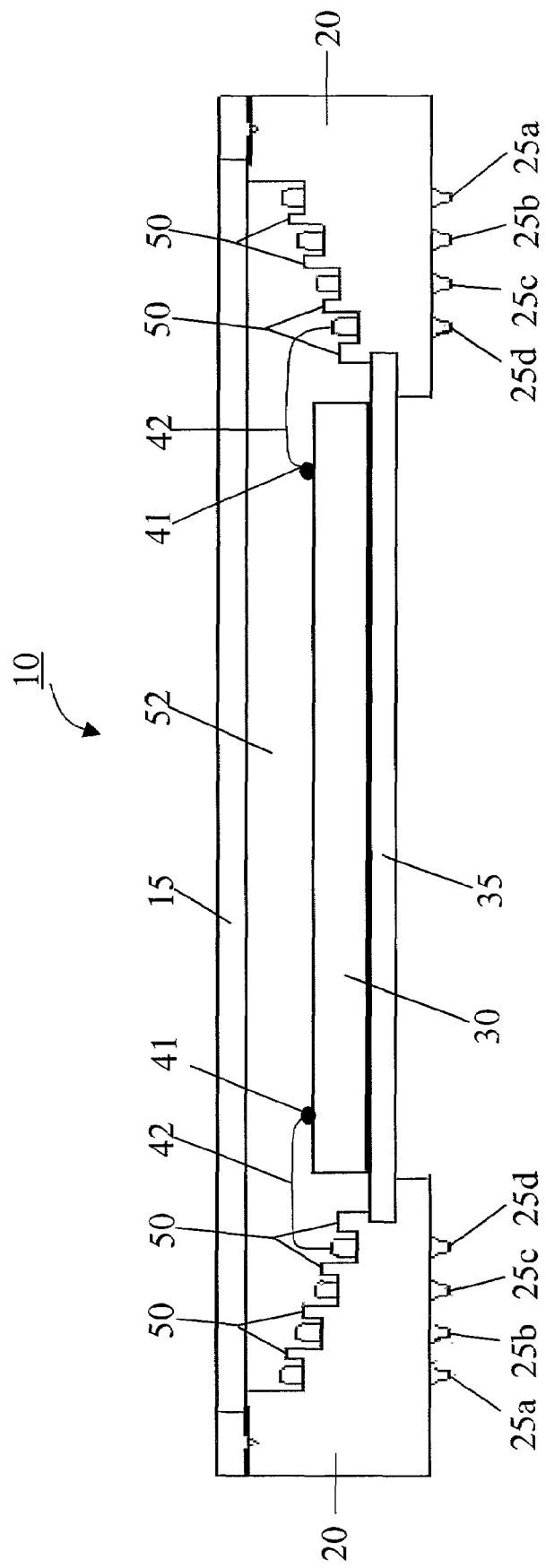
FIG. 2 is a cross-sectional view of the semiconductor package of FIG. 1.

FIG. 2 illustrates a simplified cross-sectional view of an assembled semiconductor package 10. As shown, the device 30 includes connection pads 41 that connect to the pins 25 via conductors 42. While FIG. 2 shows only a small number of connection pads 41 and conductors 42, in practice there may be a large number of connection pads 41 and conductors 42. As the pins 25 extend from the body 20, electrical signals can be applied to and received from the device 30. Soldering and/or welding can be used to connect the conductors 42 to the connection pads 41 and pins 25.

FIG. 2 also shows the pins 25 arranged in stadium-like tiers. That is, the pins 25a that are furthest from the center of the semiconductor package 10 are higher than the pins 25b that are closer to the center. Further, the pins 25b are higher than the pins 25c, which are higher than the pins 25d, which are the closest to the center of the semiconductor package. Tiering enables a high density of conductors 42. Of course, a non-tiered, conventional pin arrangement is also contemplated with the present invention. FIG. 2 also shows protrusions 50 between the pin tiers. The protrusions form interior channel walls 51 (see FIG. 5) around each pin tier. The defined channels can be filled with a sealant (again, see FIG. 5) to assist hermetic sealing of seals 45. This is described in more detail subsequently.

Still referring to FIG. 2, the body 20 includes an open cavity 52 over the mounting pad 35. The mounting pad is beneficially an integral part of the body 20. The mounting pad can be formed from the same material as the rest of the body 20, or it can be a different material that is insert molded into the body 20. Insert molding enables the mounting pad 35 to take the form of an integrated heat sink. The rest of the body is beneficially comprised of a thermosetting plastic. Thermosetting plastics have advantages of being low cost, easily molded, and readily ultrasonically welded. Still referring to FIG. 2, before the lid 15 is attached to the body 20, the open cavity is accessible by a top access port. That access port enables the device 30 to be attached to the mounting pad 35 and to be electrically connected to the pins 25. An epoxy adhesive can be used to attach the device 30 to the mounting pad 35.

Figure 3:
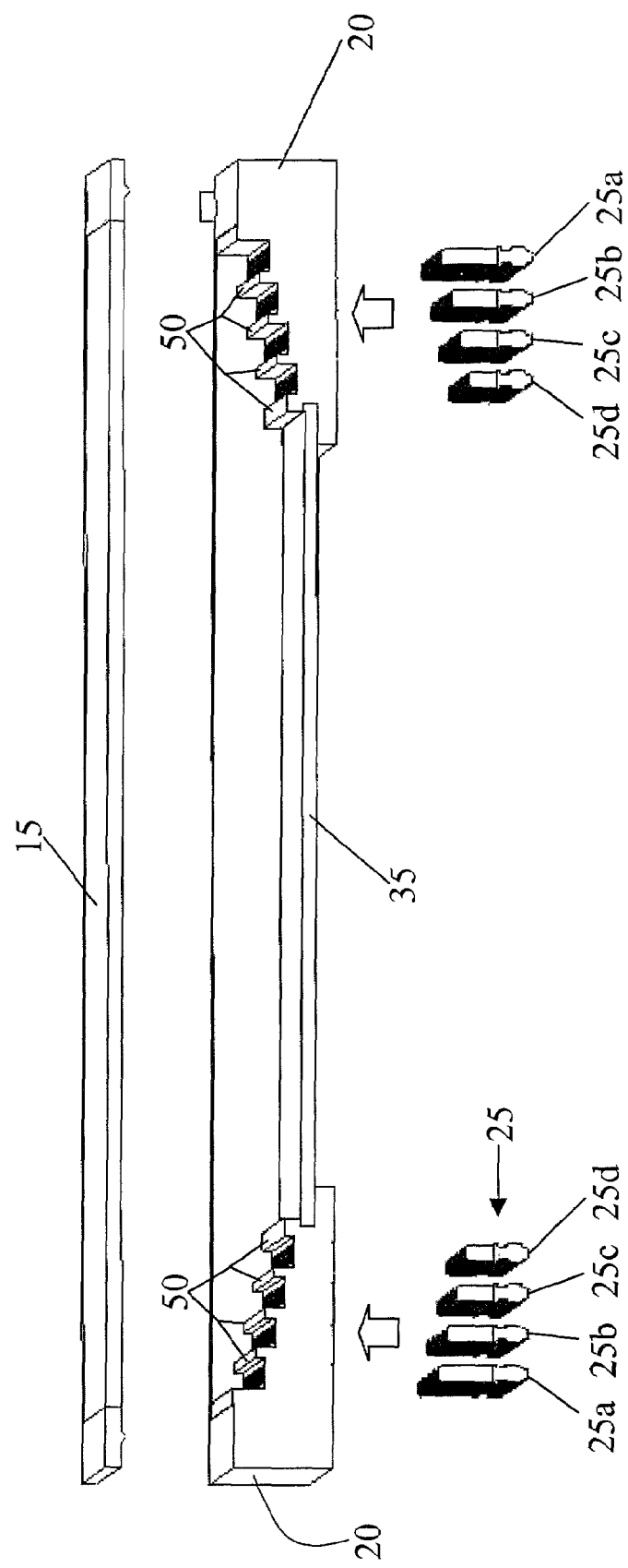
FIG. 3 is a simplified, exploded isometric view of the semiconductor package of FIG. 1.
Figure 4:
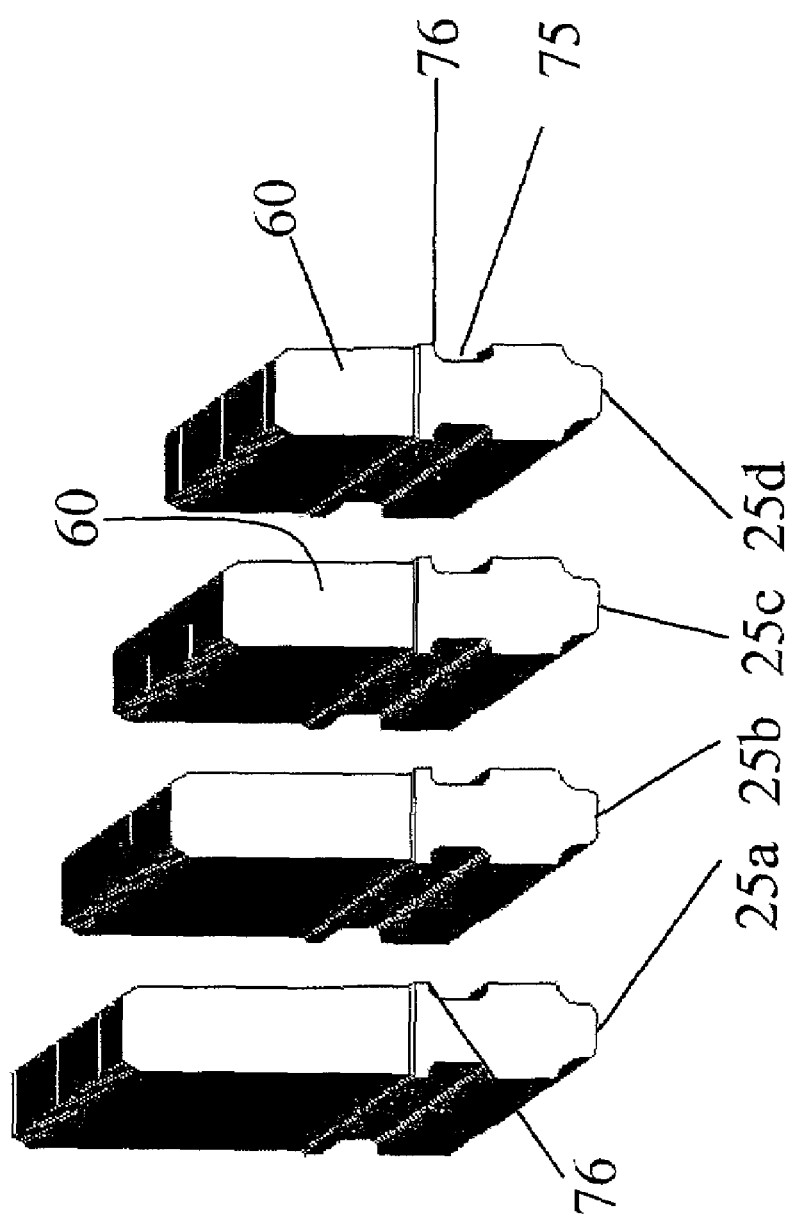
FIG. 4 illustrates the pins used in the semiconductor package of FIG. 1.

Turning now to FIG. 3, the pins 25 are beneficially inserted into the body 20 before the device 30 is attached to the mounting pad 35. The pins 25 are inserted into openings 54 in the body 20. FIG. 4 illustrates the pins 25 in more detail. As shown, the pins have different lengths. Pins 25a are longer than pins 25b, which are longer than pins 25c, which are longer than pins 25d. This length variation enables the pins to be stadium-tiered as shown in FIG. 3. Of course, the pins 25 may also have the same or substantially the same length. Each pin 25 includes an elongated body 60 having relieved portions 75. The area above each relieved portion includes outwardly directed prongs 76. The pins themselves are beneficially comprised of a conductive metal having sufficient strength to be ultrasonically welded. For example, the pins 25 may be beryllium-copper or brass. The pins 25 can be plated to assist soldering connections. The top and bottom of the elongated body 60 are substantially flat to enable electrical connections.

Figure 5:
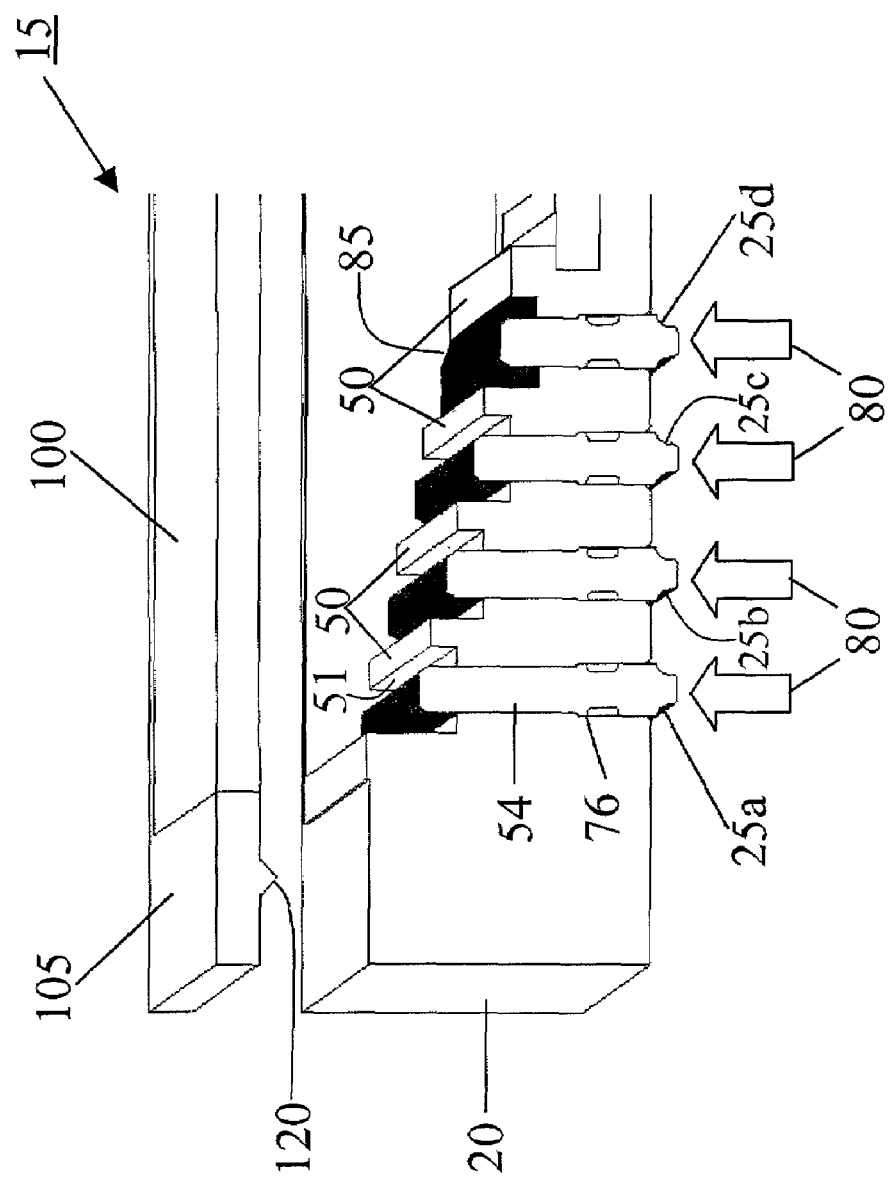
FIG. 5 is an exploded isometric view of the pins of FIG. 4 inserted and hermetically sealed to the body of the semiconductor package of FIG. 1.

Turning now to FIG. 5, the pins are inserted into the opening 54. Then, an ultrasonic welding horn is brought into physical contact with the bottom of the pins, and pressure is applied. An intense vibration from the ultrasonic welding horn produces ultrasonic energy 80. The intense vibration is transmitted through the pins 25 to the body 20, producing friction-generated heat at the prongs 76 (see FIG. 4). That heat increases the temperature of the body, causing it to melt. The melted body material flows into the relieved portions 75 (see FIG. 4). When the ultrasonic energy 80 is stopped, the melted body material solidifies, producing a hermetic seal 45 (see FIG. 1) between the body 20 and the pin 25. If the body 25 is comprised of a thermosetting plastic, the melt temperature will be typically above 500° F. However, experimentation to arrive at the correct ultrasonic welding conditions for a particular material being used should be anticipated.

Still referring to FIG. 5, the channels formed by the protrusions 50 can be filled with a sealant 85. Alternatively, a sealant 85 can be used to hermetically seal a semiconductor package without performing ultrasonic welding of the pins 25 to the body 20. A suitable sealant 85 includes a liquid epoxy applied via a liquid insertion device. If an epoxy sealant is used, the epoxy can be cured by ultraviolet light, for example. If the epoxy is subject to damage when soldering or welding the conductors 42 to the pins 25 (see FIG. 2), then the soldering or welding of the conductors 42 to the pins 25 can be performed before adding the sealant 85. Then, the sealant can be added, for example, at the ends of each tiered row.

Figure 6:
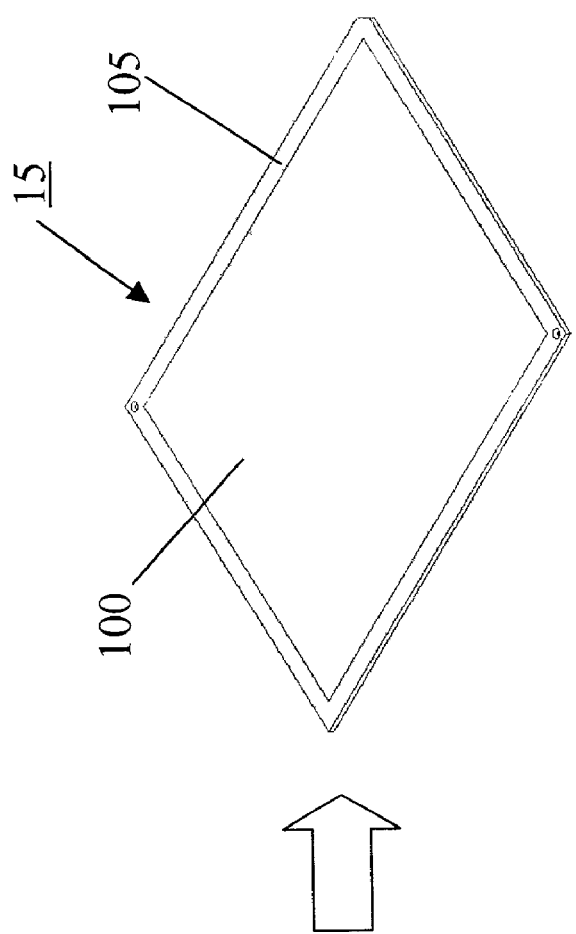
FIG. 6 illustrates the top view of the lid of the semiconductor package of FIG. 1.
Figure 6:
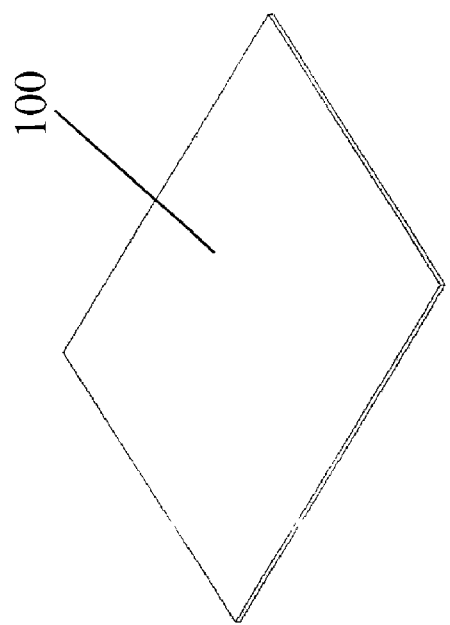
Figure 7:
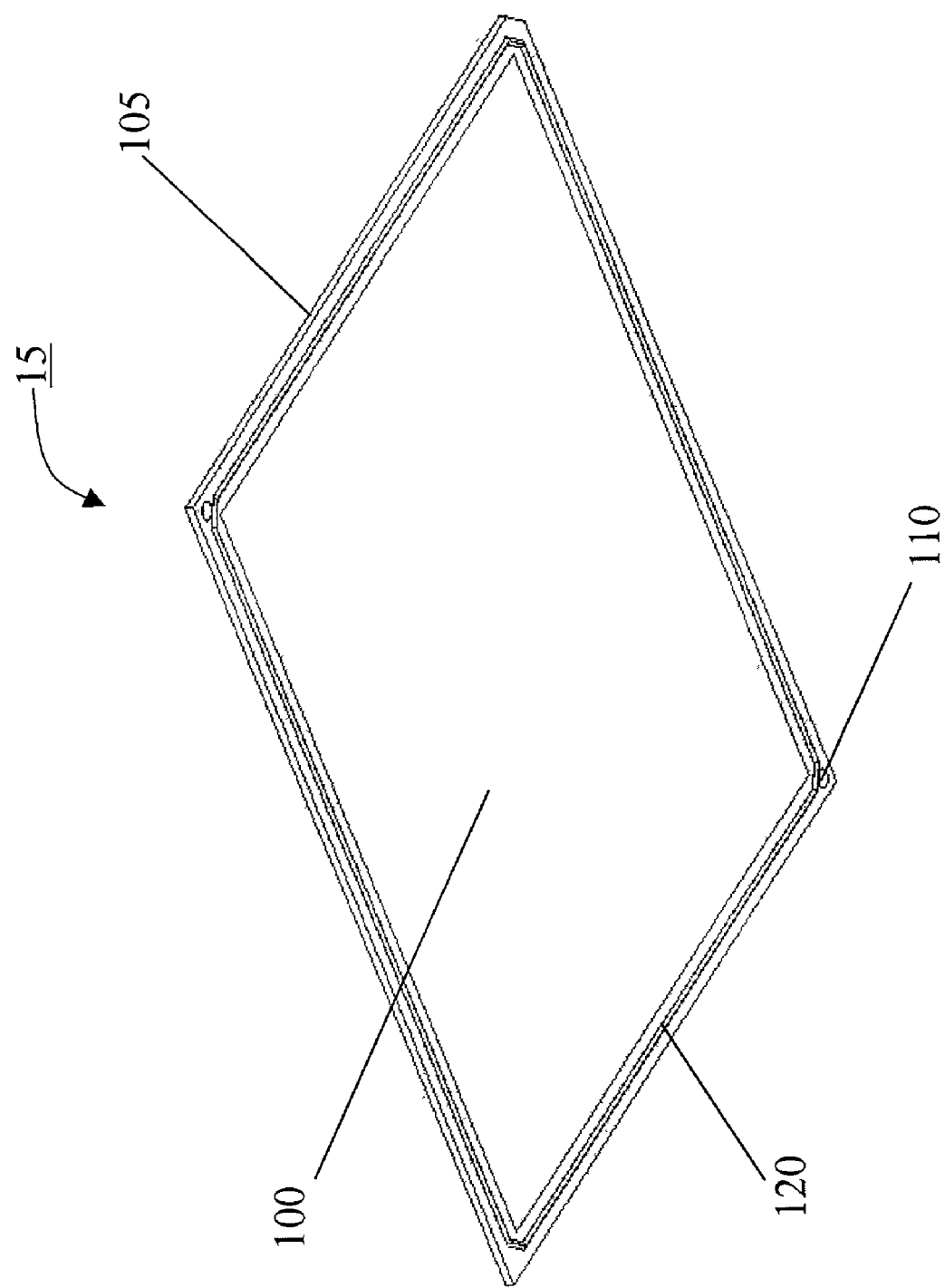
FIG. 7 illustrates the bottom view of the lid of the semiconductor package of FIG. 1.

With the device 30 attached to the mounting pad 35, the pins 25 hermetically sealed to the body 20, and the conductors 42 interconnecting the pins 25 to the device 30, the lid 15 is hermetically sealed onto the body 20. As shown in FIG. 6, the lid 15 is comprised of a center plate 100 and a molded edge 105. The center plate is beneficially comprised of a brittle material, preferably a glass or a ceramic. A molded edge 105 is of a different material than the center plate 100 and is beneficially comprised of material that is similar or identical to the body 20, preferably a thermoplastic. FIG. 7 shows a bottom view of the lid 15. The molded edge 105 may include two apertures 110, and an energy director 120 that is preferably V-shaped.

The lid 15 is beneficially an integral unit formed, for example, by insert molding the molded edge 105 and the center plate 100 together. Insert molding can be performed such that the resulting thickness of the molded edge matches that of the center plate 100. Alternatively, insert molding can be performed such that the molded edge 105 is thicker than and overlaps the center plate 100. Finally, insert molding can be performed such that the center plate is thicker than the molded edge 105. The center plate 105 can include an indenture 164 (see FIG. 10) around its perimeter to enhance the bond between the center plate 100 and the molded edge 105.

Figure 8:
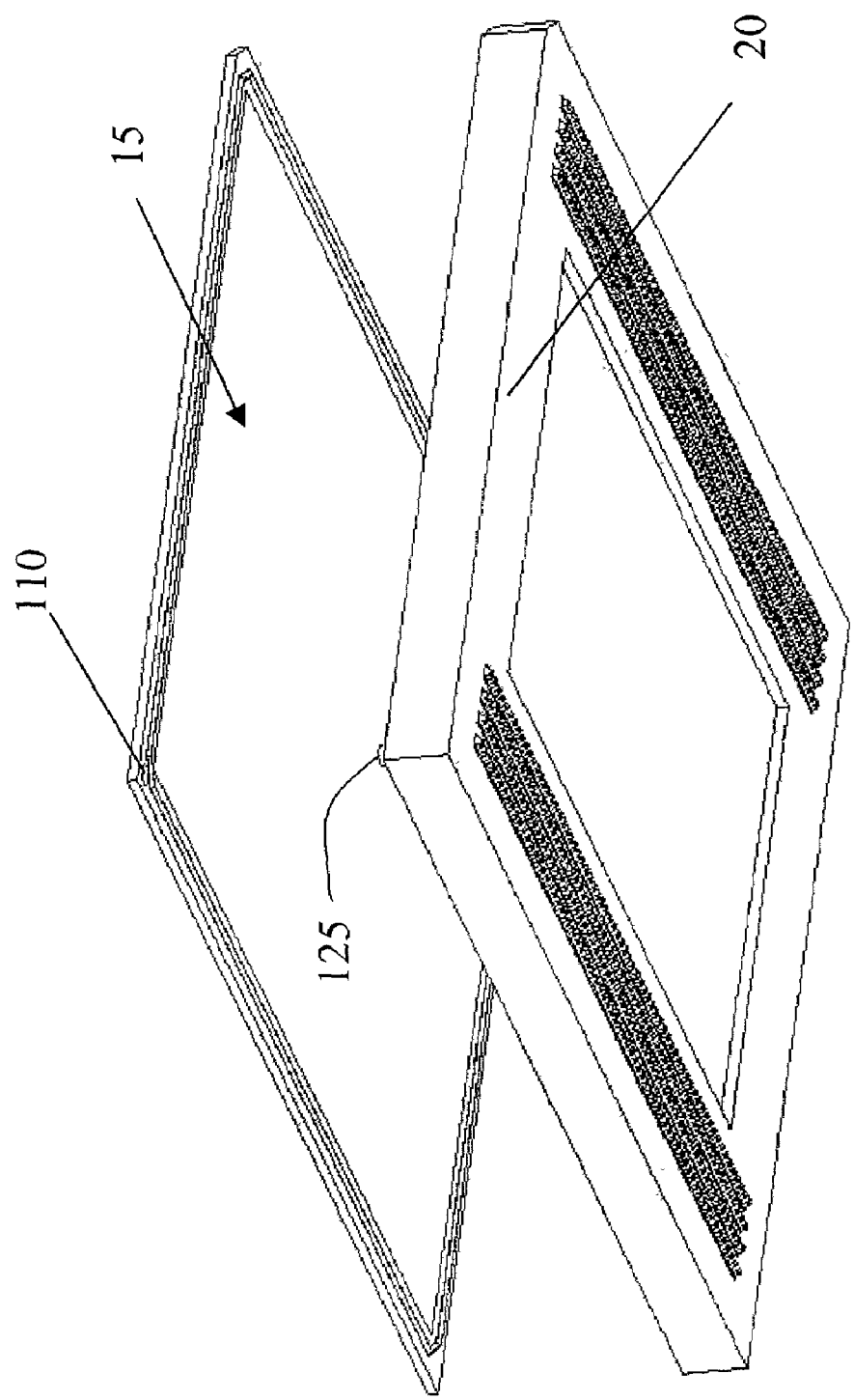
FIG. 8 is an exploded view of the lid and body of the semiconductor package of FIG. 1.

FIG. 8 illustrates attaching the lid 15 to the body 20. FIG. 8 shows attaching features that are useful for locating the lid on the body. The semiconductor package body 20 includes at least one protruding pin 125 (only one is shown in FIG. 8, but multiple protruding pins may be used), while the lid 15 includes at least one aperture 110 corresponding to the protruding pin 125. The lid 15 is then placed on the body 20 such that the protruding pin 125 fits into the aperture 110.

Figure 9:
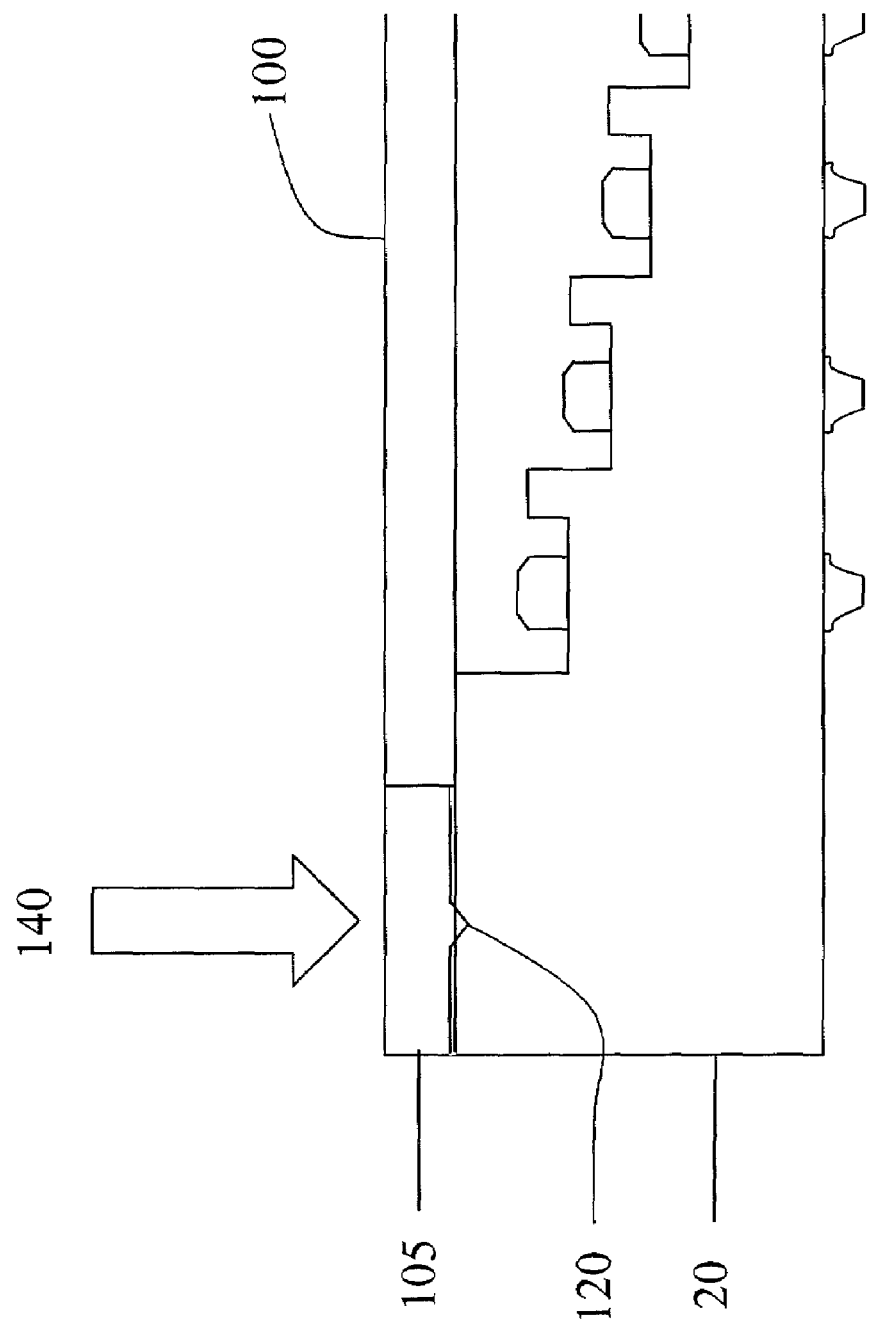
FIG. 9 illustrates ultrasonically welding the lid of FIGS. 6 and 7 to the body.

Turning now to FIG. 9, with the lid in contact with the body 20, an ultrasonic welding horn is brought into physical contact with the top of the lid at the edge 105 and a predetermined pressure is applied. An intense vibration from the ultrasonic welding horn produces ultrasonic energy 140. The intense vibration is transmitted through the edge 105 and to the energy director 120. The ultrasonic energy produces friction-generated heat that melts at least the area of the body 20 in contact with the energy director 120. That heat causes melting of the body and/or the energy director. The melted material flows between the interface of the lid 15 and the body 20. When the ultrasonic energy 140 is stopped, the melted material solidifies, producing a hermetic seal 40 (see FIG. 1) between the body 20 and the lid 15. To reduce thermal-stress problems, it is beneficial to make the body 20, the edge 105, and the energy director 120 from the same material. Experimentation to arrive at the correct ultrasonic welding conditions for a particular material being used should be anticipated.

Figure 10:
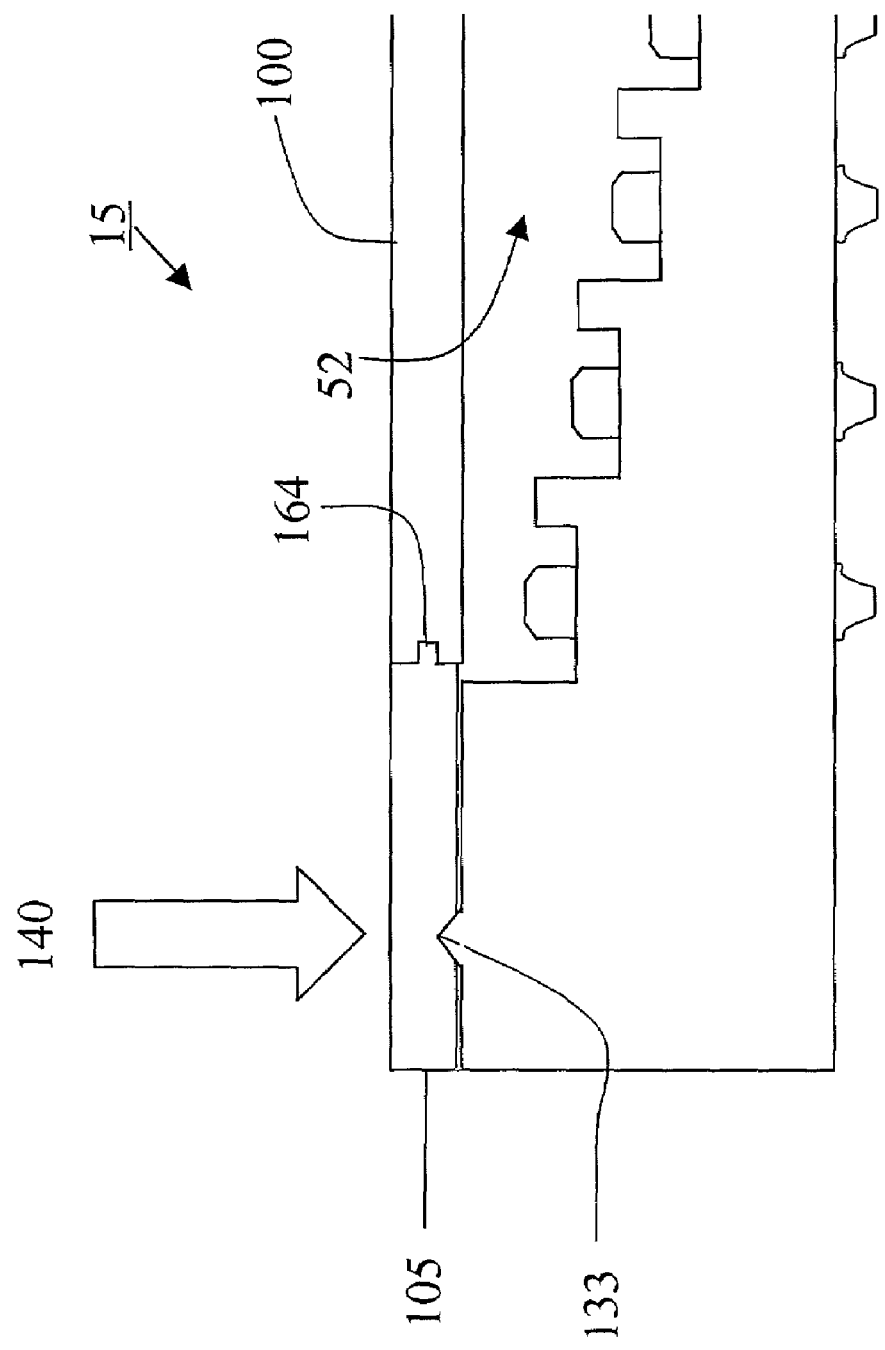
FIG. 10 illustrates an alternative semiconductor package having a body with an energy director.

FIG. 10 illustrates an alternative package that has an energy director 133 on the body instead of on the edge 105 of the lid 15. For added performance, the present invention contemplates an energy director on both the edge 105 of the lid 15 and on the body 20. Furthermore, as shown in FIG. 10, the molded edge 105 can extend over the cavity 52. FIG. 10 also shows the molded edge extending into an indenture 164 of the center plate 100, and also shows the molded edge 105 thicker than the center plate 100. The lid 15 is beneficially attached to the body 20 last.

Figure 11:
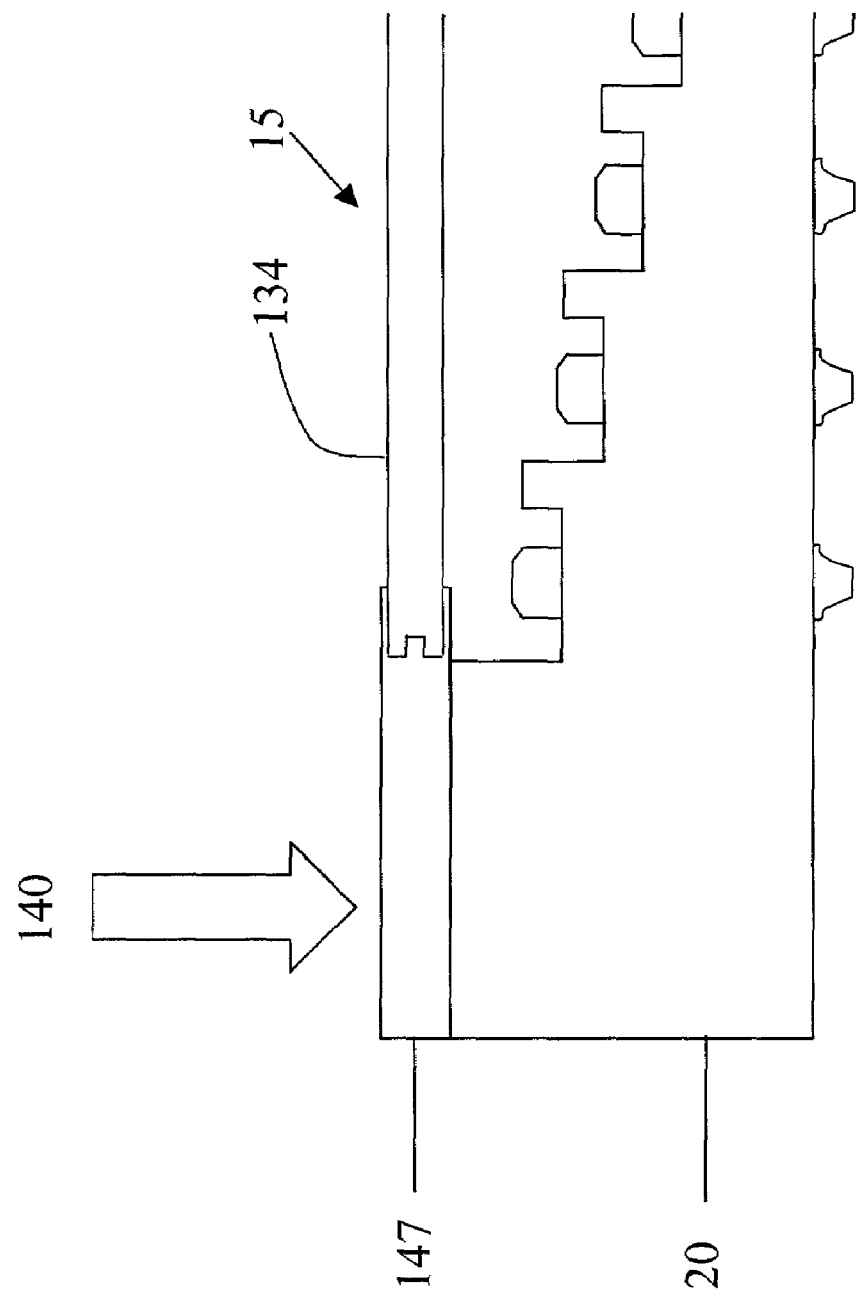
FIG. 11 illustrates an alternative semiconductor package having a lid with an indentured center plate.

FIG. 11 illustrates an alternative package that includes a lid 15 having a center plate 134 that is overlapped by a molded edge 147.

Figure 12:
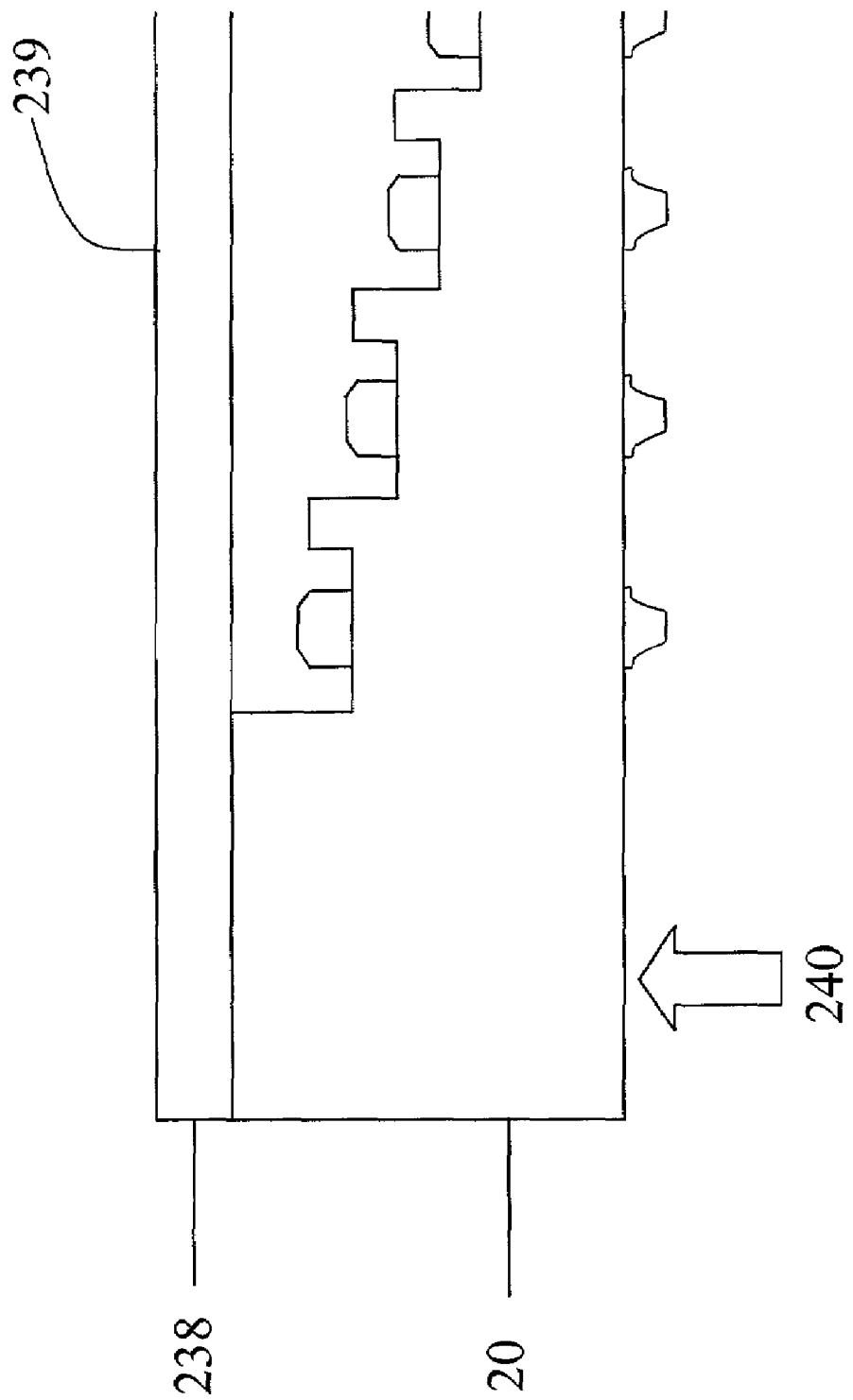
FIG. 12 illustrates an alternative semiconductor package having a lid without a molded edge.

FIG. 12 illustrates an alternative package that includes a lid 239 having a center plate 238 without a molded edge. In this case, an ultrasonic feedhorn is applied to and directs ultrasonic energy through the body 20 and toward the center plate 238. If the center plate is comprised of a brittle material, directing energy through the body 20 reduces or prevents damage to the lid 239. The appropriate materials of such lid 239 may be chosen to maximize the performance.

When assembling the semiconductor package 10, it is important that contaminants do not enter the package. To that end, it is beneficial to assemble the semiconductor package in an inert environment, such as nitrogen that is pumped into the cavity 52 during assembly. The gas pressure can help disperse and remove contaminates.

Figure 13:
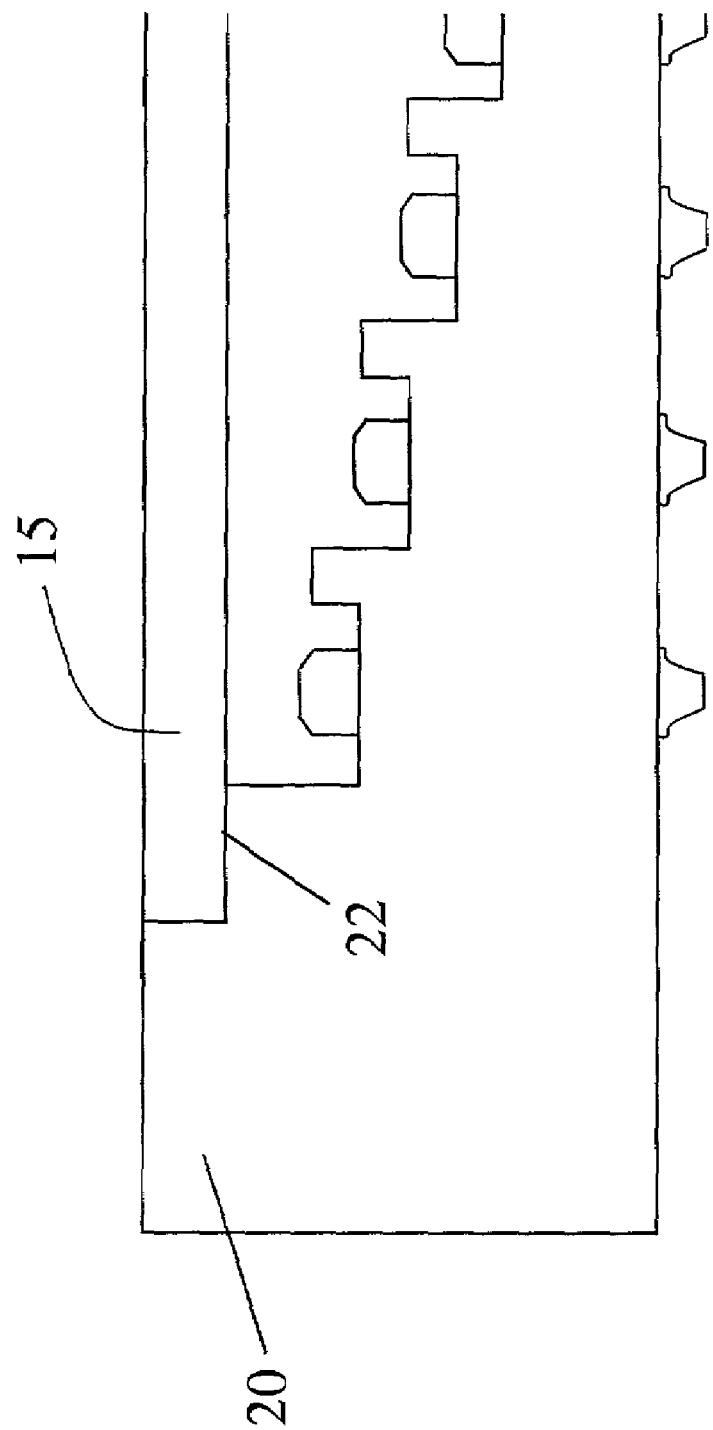
FIG. 13 illustrates an alternative semiconductor package having a lid that fits into a step in a body.

FIG. 13 shows another alternative package. This alternative package includes a lid 15 that fits onto a lid support 22 within the body 20. While the lid 15 is illustrated without a molded edge, a molded edge can be incorporated as well.

Figure 14:
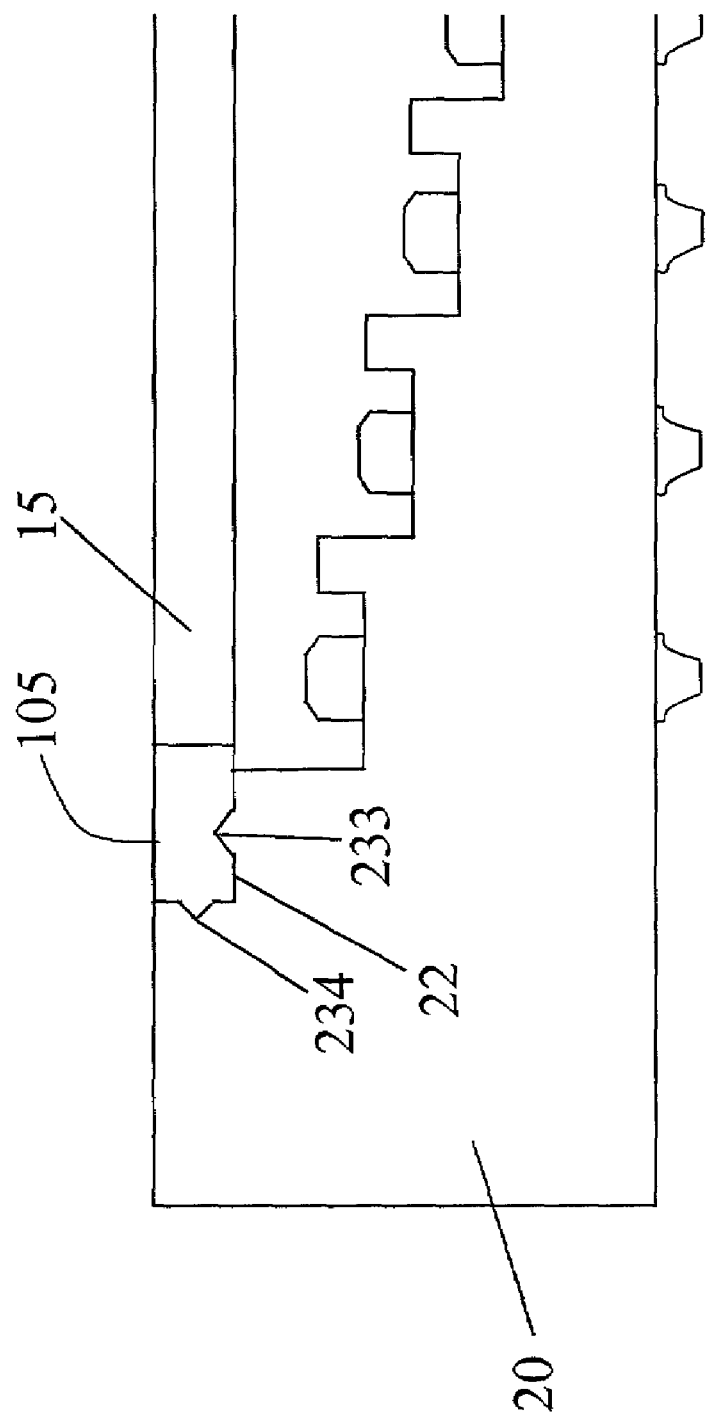
FIG. 14 illustrates an alternative semiconductor package having a lid that fits into a step in a body and that includes energy directors.

FIG. 14 shows yet another alternative package. This package, as in FIG. 13, includes a lid 15 that fits onto a lid support 22 within the body 20. However, the package of FIG. 14 includes a molded edge 105 with an energy director 234. Furthermore, the body 20 includes an energy director 233. Alternatives to the embodiment shown in FIG. 14 include using only one of the energy directors, none of the energy directors, and having two (or more) energy directors that are integral components of the molded edge 105.

Figure 15:
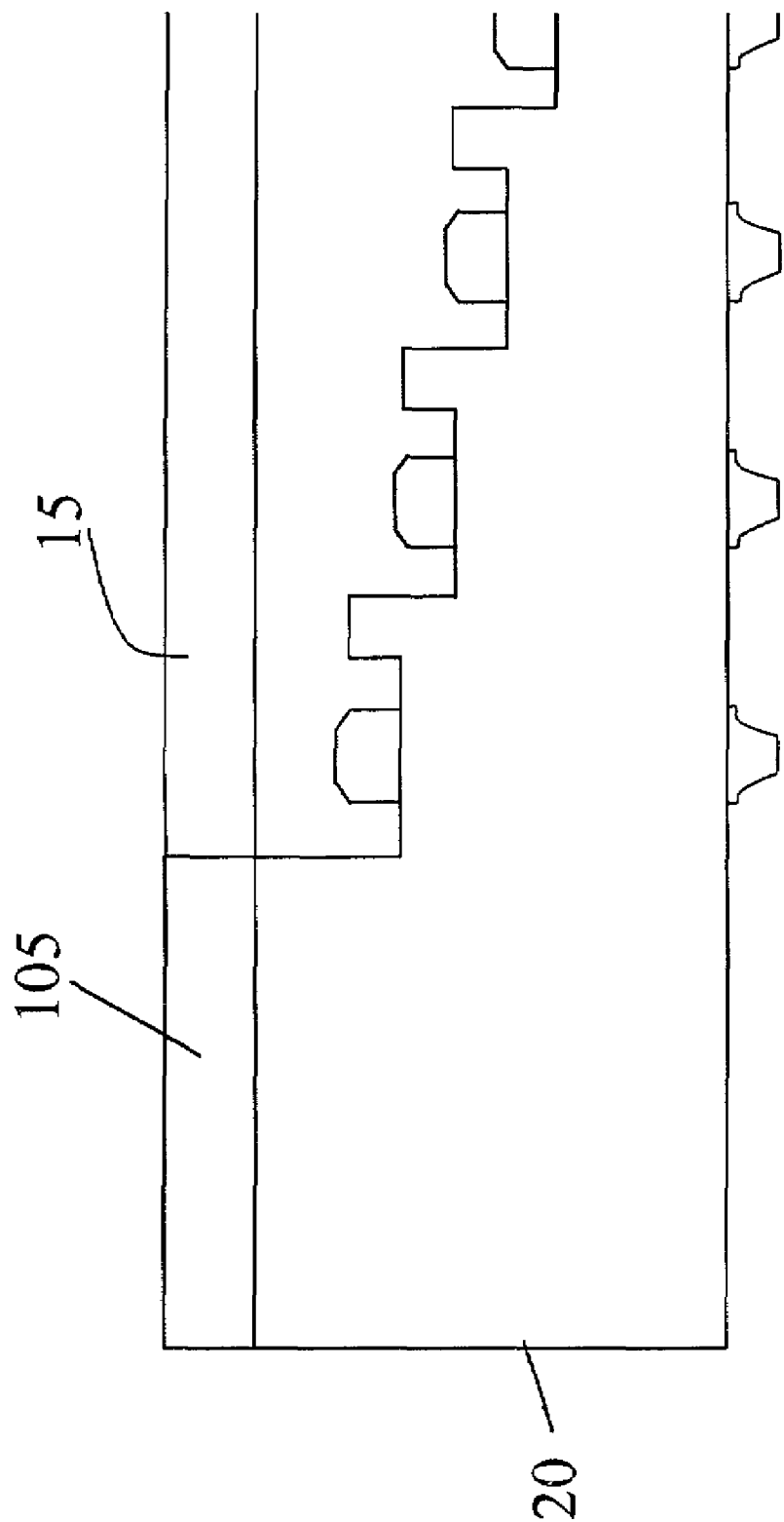
FIG. 15 illustrates an alternative semiconductor package having a lid with a molded edge.

FIG. 15 shows still another alternative package. In this embodiment, the molded edge 105 is dimensioned to be flush with the cavity of the body 20. Again, energy directors, possibly more than one, are optional.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A semiconductor package, comprising:
   a body having a cavity and a mounting pad;
   a plurality of conductive leads extending from said body; and
   a lid having a center plate of a brittle material and an insert molded edge of plastic around a perimeter of said center plate, said insert molded edge of said lid ultrasonically welded to the body;

wherein said lid forms a hermetic seal with said body and wherein said molded edge surrounds an entire perimeter of said center plate.

2. A semiconductor package according to claim 1, further including a device attached to said mounting pad.

3. A semiconductor package according to claim 2, further including a conductor electrically interconnecting said device to one of said plurality of conductive leads.

4. A semiconductor package according to claim 1, wherein said brittle material includes a ceramic.

5. A semiconductor package according to claim 1, wherein said brittle material includes a glass.

6. A semiconductor package according to claim 1, wherein said plastic includes a thermoplastic.

7. A semiconductor package according to claim 1, wherein said center plate has a first thickness and said molded edge has a second thickness, and said first thickness and said second thickness are the same.

8. A semiconductor package according to claim 1, wherein said center plate has a first thickness and said molded edge has a second thickness, said first thickness being larger than said second thickness.

9. A semiconductor package according to claim 1, wherein said center plate has a first thickness and said molded edge has a second thickness, said first thickness being less than said second thickness.

10. A semiconductor package according to claim 1, wherein said perimeter of said center plate includes an indenture.

11. A semiconductor package according to claim 1, wherein said molded edge includes an energy director.

12. A semiconductor package according to claim 11, wherein said energy director has a V-shape.

13. A semiconductor package according to claim 1, wherein said molded edge includes a locating feature.

14. A semiconductor package according to claim 13, wherein said locating feature includes an aperture.

15. A semiconductor package according to claim 1, wherein said body includes a plastic.

16. A semiconductor package according to claim 15, wherein said plastic includes a thermosetting plastic.

17. A semiconductor package according to claim 1, wherein said body include an energy director.

18. A semiconductor package according to claim 17, wherein said energy director is V-shaped.

19. A semiconductor package according to claim 1, wherein said body includes a locating feature.

20. A semiconductor package according to claim 19, wherein said locating feature includes a protrusion.

21. A semiconductor package according to claim 1, wherein said body includes a plurality of openings, and each of said plurality of conductive leads corresponds to one of said plurality of openings.

22. A semiconductor package according to claim 21, wherein each of said plurality of conductive leads forms a hermetic seal with said body.

23. A semiconductor package according to claim 21, wherein each of said plurality of conductive leads includes an elongated body with a relieved portion and with an outwardly directed projection.

24. A semiconductor package according to claim 1, wherein said body further includes a lid support within said body.

25. A semiconductor package according to claim 24, wherein said lid is attached to said lid support.

26. A semiconductor package according to claim 25, wherein said body includes an energy director.

27. A semiconductor package according to claim 25, wherein said molded edge includes an energy director.

28. A method of hermetic sealing a semiconductor package, comprising:

providing a lid having a center plate of a brittle material and a molded edge of a readily ultrasonically weldable material around a perimeter of said center plate;

locating said lid on a body;

placing said lid on said body; and directing ultrasonic energy through said lid and onto said body to weld the lid to the body, wherein the ultrasonic energy will melt the weldable material then cool to join the lid to the body.

29. A method of sealing a semiconductor package according to claim 28, wherein the body is comprised of a plastic.

30. A method of sealing a semiconductor package according to claim 29, wherein the body includes a thermoplastic body.

31. A method of sealing a semiconductor package according to claim 29, wherein the body includes an energy director.

32. A method of sealing a semiconductor package according to claim 31, wherein said energy director is V-shaped.

* * * * *